United States Patent
Hess et al.

(10) Patent No.: US 8,105,933 B2
(45) Date of Patent: Jan. 31, 2012

(54) LOCALIZED ALLOYING FOR IMPROVED BOND RELIABILITY

(75) Inventors: Kevin J. Hess, Austin, TX (US); Chu-Chung Lee, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 646 days.

(21) Appl. No.: 11/669,556

(22) Filed: Jan. 31, 2007

(65) Prior Publication Data

US 2008/0179745 A1  Jul. 31, 2008

(51) Int. Cl.
*H01L 21/44* (2006.01)

(52) U.S. Cl. ........ 438/612; 438/627; 438/643; 438/615; 438/617; 438/613; 438/614; 438/652; 257/750; 257/690; 257/E21.519

(58) Field of Classification Search .................. 438/627, 438/643, 612, 615, 617, 613, 614, 652; 257/751, 257/690, E21.519
See application file for complete search history.

(56) References Cited

U.S. PATENT DOCUMENTS

| | | | |
|---|---|---|---|
| 4,517,252 A * | 5/1985 | Hugh | 428/553 |
| 5,455,195 A * | 10/1995 | Ramsey et al. | 438/612 |
| 6,329,722 B1 | 12/2001 | Shih et al. | |
| 6,452,271 B2 | 9/2002 | Jiang et al. | |
| 6,519,845 B1 | 2/2003 | Cutting et al. | |
| 6,635,362 B2 * | 10/2003 | Zheng | 428/678 |
| 6,759,597 B1 | 7/2004 | Cutting et al. | |
| 6,784,088 B2 | 8/2004 | Edelstein et al. | |
| 2002/0175424 A1 | 11/2002 | Kripesh et al. | |
| 2003/0071319 A1 | 4/2003 | Stierman et al. | |
| 2005/0104207 A1 | 5/2005 | Dean et al. | |

OTHER PUBLICATIONS

Wulff, F.W. et al., "Characterisation of Intermetallic Growth in Copper and Gold Ball Bonds on Aluminium Metallisation," 6 pages.
Levine, Lee, et al., "Improving Intermetallic Reliability in Ultra-Fine Pitch Wire Bonding," SEMICON Singapore, pp. 1-5, © SEMI 2004.

* cited by examiner

*Primary Examiner* — Junghwa M Im
(74) *Attorney, Agent, or Firm* — Zagorin O'Brien Graham LLP

(57) ABSTRACT

In some embodiments a method of forming a gold-aluminum electrical interconnect is described. The method may include interposing a diffusion retardant layer between the gold and the aluminum (1002), the diffusion retardant layer including regions containing and regions substantially devoid of a diffusion retardant material; bringing into contact the diffusion retardant layer, the gold, and the aluminum (1004); forming alloys of gold and the diffusion retardant material in regions containing the material (1006) and forming gold-aluminum intermetallic compounds in regions substantially devoid of the material (1008); and forming a continuous electrically conducting path between the aluminum and the gold (1010). In some embodiments, a structure useful in a gold-aluminum interconnect is provided. The structure may include an aluminum alloy bond pad (530) and a diffusion retardant layer (520) in contact with the bond pad, the diffusion retardant layer including regions (522) containing and regions (524) substantially devoid of a diffusion retardant material. The structure may include a gold free air ball (714) in contact with the diffusion retardant layer.

10 Claims, 6 Drawing Sheets

LOCALIZED ALLOYING FOR IMPROVED BOND RELIABILITY

BACKGROUND

1. Field

This invention relates to integrated circuit manufacturing. More particularly, it relates to a method of localized alloying for improved bond reliability, and to bonds made by the method.

2. Related Art

Aluminum bond pads and aluminum-gold wirebonding and ball bonding are ubiquitous in the field of integrated circuit manufacturing. Asymmetric interdiffusion rates, however, often lead to the formation of Kirkendall voids. Coalescence of these voids, driven by the formation of brittle gold-aluminum intermetallic compounds, can increase the resistance and degrade the structural properties of the bond, providing a common mechanism of premature failure of the ball bond. As is the case for many diffusion-driven processes, the rate of growth of the intermetallics, and so of the degradation of desirable bond properties, increases with increasing temperature.

Several approaches have been taken to reduce or prevent the formation of the voids, caused by gold diffusing into aluminum at a higher rate than aluminum diffuses into gold. One such approach is to dope the bulk gold wire with a material such as palladium to effectively decrease the diffusion of gold into aluminum, and so formation of voids. The wire may also be doped with other elements to control grain growth during free air ball formation and strain hardening during loop formation. While doping can facilitate bond formation, the strain hardening tends to improve the stiffness of the wire spans and resistance to wiresweep during molding. Often the alloying process increases the resistivity of the wire. It may also increase the degree of work hardening during loop formation, which may result in minimum loop radii larger than those needed for the small loops in thin mold cap and stacked die applications.

In addition, bulk doping solutions generally have not solved the problem of intermetallic compound-driven bond failure in cases where the ball bond-to-pad interfacial area is small, such as for the ultrafine pitch wirebonds that are becoming increasingly common. In uses where long life and high reliability are required, such as automotive, aerospace, and military applications, or that require operation at high temperatures, premature bond failure presents a significant problem.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
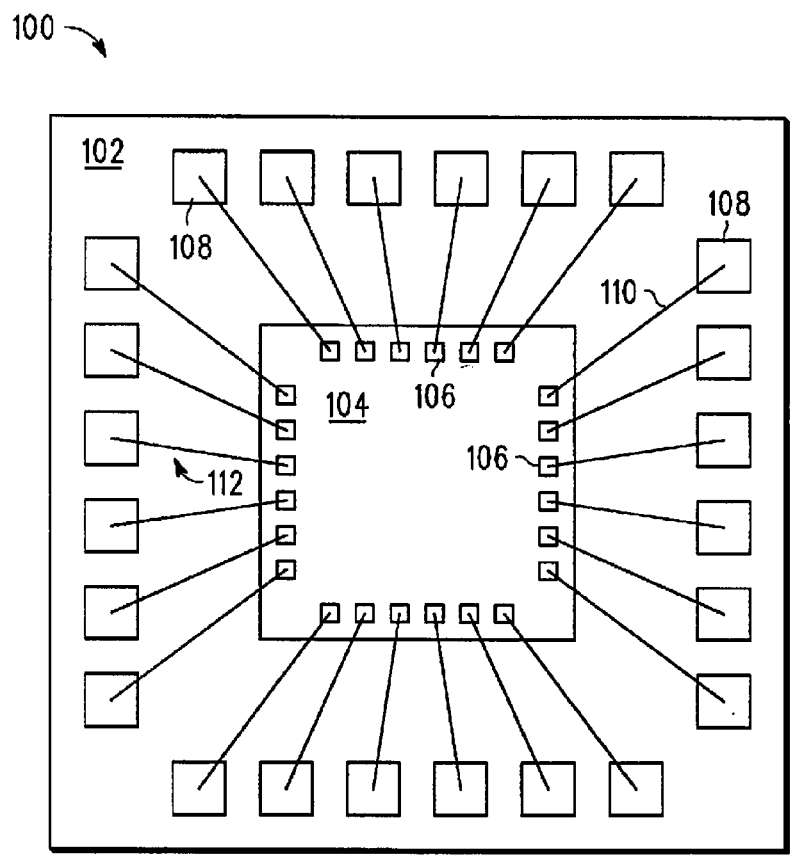
FIG. 1 is a top view of a wirebonded integrated circuit prior to the encapsulation process.

Bulk doping of bond wires or bond pads transforms the properties of the wire or bond pad throughout its extent. In the case of diffusion barrier dopants, interdiffusion between gold and aluminum is inhibited to retard the formation rate of intermetallic compounds (IMCs) and of the associated voids. IMCs form the structural and electrical bonds between the aluminum and the gold, but they are often brittle. In addition, formation of gold-rich IMCs may result in depletion of the gold near the gold-aluminum interface and leave behind voids. Coalescence of these voids may lead to bond failure. In cases of bulk retardation of IMC formation, initial bond strength may be compromised. Recognizing the need for both initial IMC formation and retardation of interdiffusion of the gold and aluminum, a method of forming reliable and long-lived bonds and the bonds so formed are described herein.

It should be understood that in this description, as in the art generally, materials referred to by their elemental names may contain trace impurities and/or be alloyed with small amounts of other materials. For example, the bond pad material commonly referred to as "aluminum" in the art may be alloyed with copper or silicon or both in small amounts, such as a few percent by weight or less, to modify certain properties of pure aluminum. Similarly, "doped gold" refers to bulk gold alloyed with a diffusion barrier material, which may contain other impurities or minor alloy components, while "gold" or "undoped gold" is not alloyed with a diffusion barrier material in amounts useful to retard diffusion of gold into aluminum. A diffusion retardant material may be elemental or alloyed with another material and may contain trace impurities, without its behavior as a diffusion retarding material being compromised. The regions of a diffusion retardant layer described as "substantially devoid of" or "substantially without" diffusion retarding material may contain amounts of the material or its alloys insufficient to retard diffusion of gold into aluminum.

As used herein the term "diffusion retardant layer" refers to an at least partially formed layer of material having regions containing a diffusion retarding material. The layer may be a film of diffusion retardant material thin enough to have pinholes, voids, or other defects, resulting in regions essentially devoid of the diffusion retarding material, e.g., the pinhole regions, and regions containing the diffusion retardant material. The diffusion retardant layer may be a discontinuous layer providing incomplete coverage of the substrate on which it is deposited, resulting in regions containing a diffusion retardant material and regions essentially devoid of it. The diffusion retardant layer need not be a continuous layer. It may be a collection of islands formed on a supporting substrate resulting in regions, e.g. the islands, containing a diffusion retardant material and regions without it. The thickness of the diffusion retardant layer may vary from virtually zero to approximately 10 nm, and may be non-uniform throughout the layer. The composition of regions of the diffusion retardant layer containing a diffusion retarding material need not be constant; greater and lesser concentrations of the diffusion retarding material may be found in different regions so long as a concentration sufficient to retard the diffusion of gold into aluminum exists in the regions. The composition of regions essentially devoid of the diffusion retardant material need not be constant. Regions devoid of a diffusion retardant material may be voids or other gaps containing virtually no gold, aluminum, or diffusion retardant material. Regions substantially without a diffusion retarding material may contain varying amounts of a diffusion retarding material in concentrations insufficient to retard diffusion of gold into aluminum.

Thus, in some embodiments, a method of forming a gold-aluminum electrical interconnect is described. Such a method may include interposing a diffusion retardant layer between the gold and the aluminum, with the diffusion retardant layer including regions containing a diffusion retardant material and regions substantially devoid of the diffusion retardant material; bringing into contact the diffusion retardant layer, the gold, and the aluminum; forming alloys of gold and the diffusion retardant material in regions containing the diffusion retardant material and forming gold-aluminum intermetallic compounds in regions substantially devoid of the diffusion retardant material; and forming a continuous electrically conducting path between the aluminum and the gold. Again, regions of a diffusion retardant layer described as "substantially devoid of" or "substantially without" diffusion retarding material may contain amounts of the material or its alloys insufficient to retard diffusion of gold into aluminum. In some embodiments the diffusion retardant material may include one or more of copper, molybdenum, rhodium, palladium, silver, rhenium, iridium, and platinum. In some embodiments the interdiffusion rate of gold into the diffusion retardant material is less than the interdiffusion rate of gold into aluminum.

In some instances, the diffusion retardant layer may be interposed by being deposited on an aluminum bond pad or a free air ball to form regions with and regions substantially without a diffusion retardant material. The diffusion retardant layer may in some instances be interposed by depositing a diffusion retardant material (pristine or alloyed with aluminum) on an aluminum bond pad and then forming regions with the diffusion retardant material and regions substantially without by segregation of the diffusion retardant material. In some embodiments, a gold wire is in contact with the free air ball and there is a continuous electrical path between the bond pad and the wire.

In some embodiments, a structure suitable for use in a gold-aluminum interconnect is provided. In some implementations, the structure includes an aluminum alloy bond pad and a diffusion retardant layer in contact with the bond pad, with the diffusion retardant layer including regions containing a diffusion retardant material and regions substantially devoid of the diffusion retardant material. In some embodiments, the structure also includes a gold free air ball in contact with the diffusion retardant layer.

In some embodiments, a packaged integrated circuit is described. The packaged integrated circuit includes an integrated circuit with an aluminum bond pad formed on it, and a diffusion retardant layer in contact with the bond pad, with the diffusion retardant layer including regions containing a diffusion retardant material and regions substantially devoid of the diffusion retardant material. In some embodiments the structure also includes a gold ball bond in contact with the diffusion retardant layer.

FIG. 1 is a plan view of a packaged integrated circuit 100. The packaged integrated circuit 100 generally includes a package substrate 102 and an integrated circuit 104. Here the word "die" is used interchangeably with "integrated circuit." The die 104 includes bond pads 106 for electrical access to the functional circuitry of the die. The bond pads 106 may be made of aluminum, aluminum alloyed with copper and/or silicon, or aluminum on copper. The package substrate 102 includes bond pads 108 for making electrical connections to the substrate. The bond pads 108 may be made of aluminum, aluminum alloyed with copper and/or silicon, aluminum on copper, gold, or gold on copper. Wirebonds 112 are formed between the die pads 106 and substrate pads 108 for further coupling to other structures. The wirebonds may be made of gold, gold alloyed with other elements, copper, or aluminum. In the exemplary structure depicted in FIG. 1 the wirebonds are made from gold or gold alloy wire.

Figure 2:
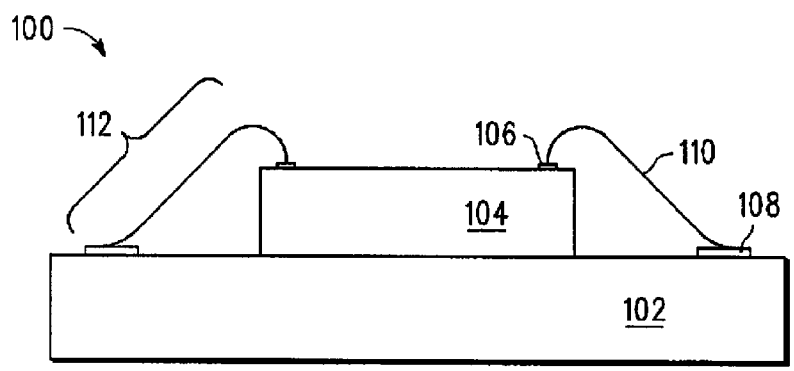
FIG. 2 is a cross-sectional view of a wirebonded IC as depicted in FIG. 1.

A side view of a packaged integrated circuit 100 is depicted in FIG. 2. Wire 110 is bonded to a bond pad 106 and pad 108 to form an electrical connection between the integrated circuit 104 and the package substrate 102. Although a wirebond 112 is depicted and the description refers to a wirebond as a concrete example, other bonding arrangements may be substituted for the wirebond.

Figure 11:
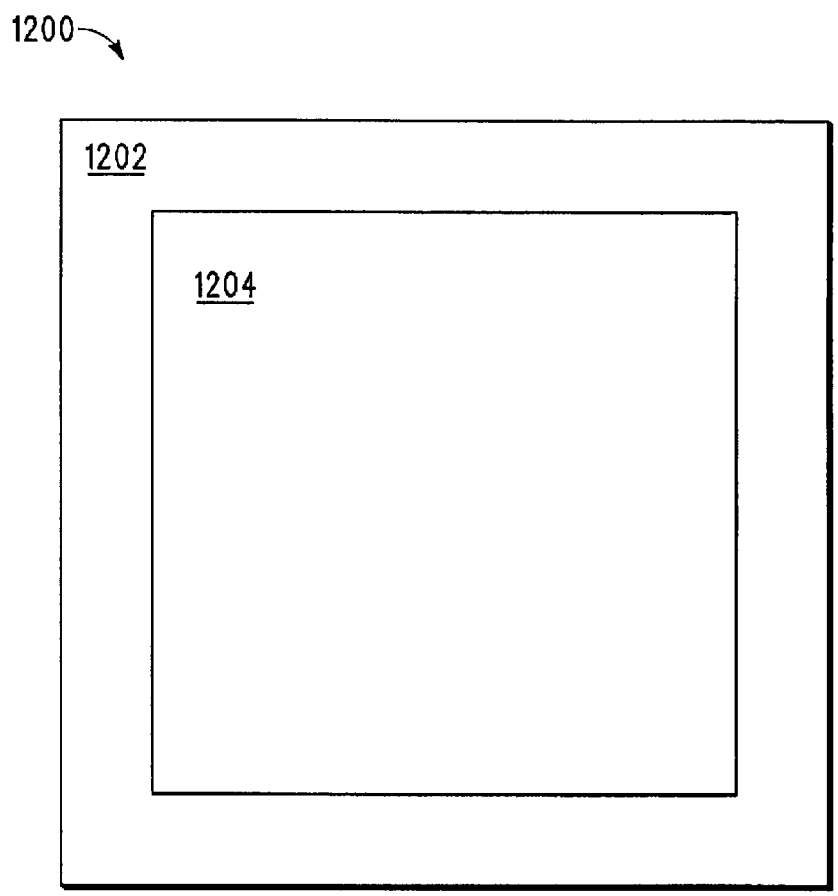
FIG. 11 is a top view of a stud bump integrated circuit.

One such alternate embodiment is depicted in FIG. 11. FIG. 11 is a plan view of a packaged integrated circuit 1200. The packaged integrated circuit 1200 includes a package substrate 1202 and an integrated circuit 1204 located over the package substrate. Again "die" is used interchangeably with "integrated circuit." The die 1204 includes bond pads 1206 for electrical access to the functional circuitry of the die. The bond pads 1206 may be made of aluminum, aluminum alloyed with copper and/or silicon, or aluminum on copper. The package substrate 1202 includes bond pads 1208 on the substrate for making electrical connections to the substrate. The bond pads 1208 may be made of aluminum, aluminum alloyed with copper and/or silicon, aluminum on copper, gold, or gold on copper. Stud bumps 1210 are formed on the die pads 1206. In the exemplary embodiment of FIG. 11, the bumps 1210 may be gold bumps formed by any of the well known wirebond processes. The bumps 1210 on die 1204 are bonded to the substrate pads 1208 for further connection to larger structures.

Figure 12:
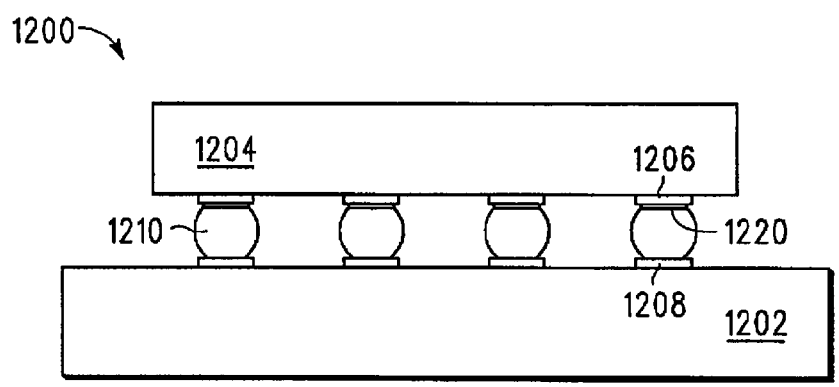
FIG. 12 is a cross-sectional view of a stud bump IC as depicted in FIG. 11.

A side view of the packaged integrated circuit 1200 is depicted in FIG. 12. Bump 1210 is bonded to bond pad 1206 and pad 1208 to form an electrical connection between the integrated circuit 1204 and the package substrate 1202. A diffusion retardant layer 1220 is interposed between bond pads 1206 and bump 1210; such a layer may also or instead be interposed between bump 1210 and pad 1208.

Figure 3:
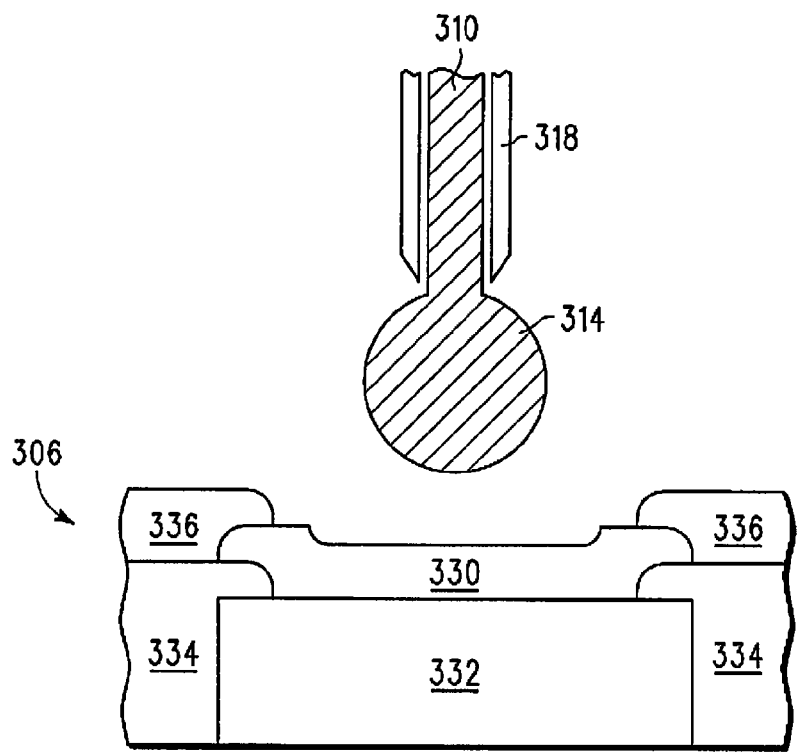
FIG. 3 is a side view of a wire, a free air ball, and a bond pad prior to bonding.

FIG. 3 depicts a side view of a prior art wirebond at a stage prior to completion of the bond. An exemplary bond pad structure 306 comprises an aluminum bond pad 330 on a substrate 332 and two passivation layers 334, 336. The substrate 332, for example, may be a mechanical support for the bond pad 330 or may include electrical circuitry such as active circuitry and conductive interconnects, some of which may be electrically coupled to bond pad 330. A wire 310 is held in a capillary 318 while a free air ball (FAB) 314 is formed by electrical flame-off (EFO), becoming the terminus of the gold wire 310. The FAB 314 is then lowered to contact the aluminum bond pad 330 of the bond pad structure 306, compressed, and subjected to ultrasonic energy (USE). The vibration of the USE effectively scrubs the FAB 314 against the aluminum bond pad 330, promoting grain boundary slip and interdiffusion of the metal of the FAB and the metal of the bond pad, creating a conductive intermetallic bond.

Figure 4:
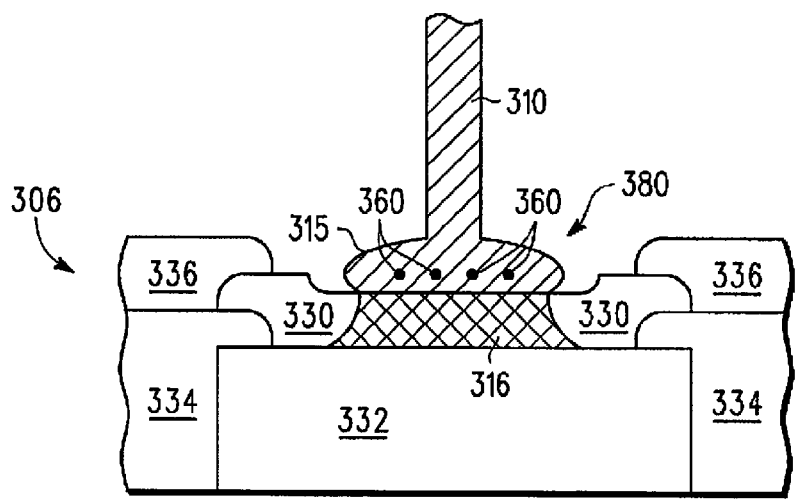
FIG. 4 is a side view of a wire, a free air ball, and a bond pad after bonding.

Turning to FIG. 4, a prior art aluminum-gold bond 380 is shown. In the case of traditional gold wirebonding onto aluminum bonding pads, intermetallic compounds 316 form right away, creating the gold-aluminum bond 380 between the bonded ball 315 and the bond pad 330. These intermetallics 316 then grow over the bond lifetime. When the wire 310 is made of palladium-doped gold, intermetallic formation is retarded in general, improving bond lifetime at the expense of initial bond strength. In both cases intermetallics 316 grow uniformly, leaving Kirkendall voids 360 on the gold side of the bond. The Pd doping of the gold wire 310 may alter the electrical properties of the bulk wire by decreasing its conductivity relative to undoped gold wire.

Figure 5:
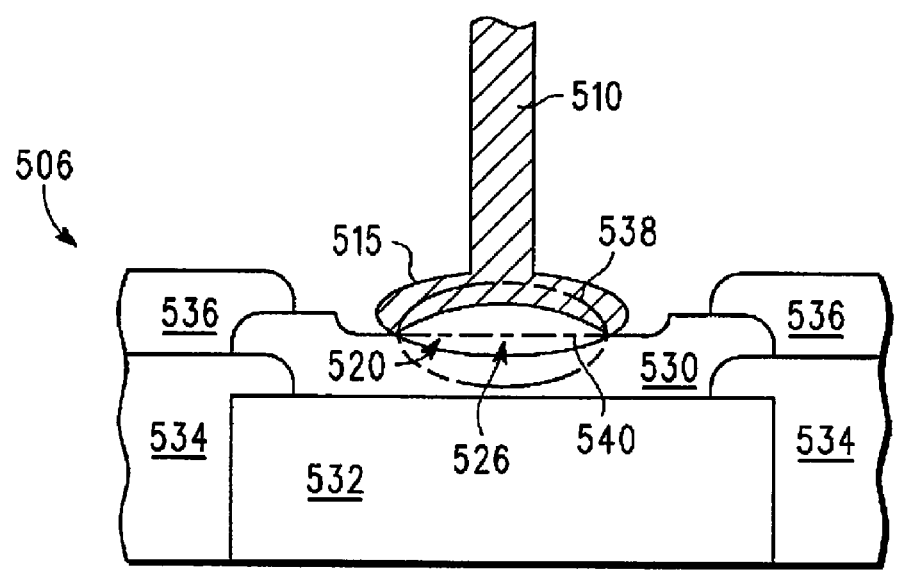
FIG. 5 is a side view of a wire, a free air ball, a diffusion retardant layer, and a bond pad after bonding.

FIG. 5 depicts a high-reliability, long-lived bond between gold and aluminum formed by the methods described herein. A bond pad structure 506 includes an aluminum bond pad 530 over a substrate 532, and passivation layers 534 and 536. A diffusion retardant layer 520 has been interposed between a gold ball bond 515 with gold wire 510 attached and the aluminum bond pad 530 of the bond pad structure 506. The gold ball bond 515 has been formed by bringing the gold free air ball terminus of gold wire 510 into contact with the bond pad 506 by, in this case, a conventional thermosonic ball bonding process. The non-uniform distribution of diffusion retardant material 540 at the aluminum-gold interface 526 results in a structure in which the gold ball bond 515 is in direct contact with the aluminum bond pad 530 in regions 524 (see FIG. 6) in which the diffusion retardant layer 520 lacks the diffusion retarding material 540 in an interfacial region 538.

Figure 6:
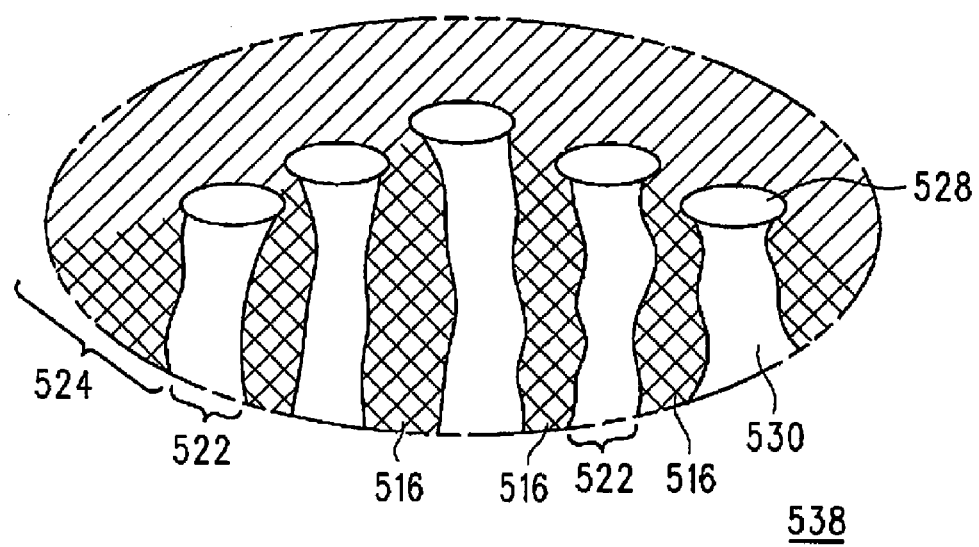
FIG. 6 shows a detail of an interfacial region of the structure of FIG. 5.

The gold-aluminum interfacial region 538 of FIG. 5 is enlarged in FIG. 6 to more clearly show the non-uniform microstructure resulting from the interposition of the diffusion retardant layer 520 at the interface 526 between the gold ball bond 515 and the aluminum bond pad 530. FIG. 6 is a rendering intended to illustrate an exemplary microstructure rather than representing any specific one resulting from the choice of a particular diffusion retarding material 540. In regions 524 lacking in the diffusion retardant material, gold and aluminum are in direct contact and intermetallic compounds 516 form right away, creating the aluminum-gold bond. These intermetallic compounds 516 continue to grow, but instead of growing uniformly across the area of the bond, they are confined at first to regions 524 substantially devoid of the diffusion retarding material 540, here palladium. In regions 522 where the diffusion retardant layer 520 contains the diffusion retarding material 540, intermetallic compound formation is slowed by the formation of gold alloys 528 incorporating the diffusion retarding material 540. During the lifetime of the bond, the diffusion retarding material 540 gradually diffuses toward areas of lower concentration, allowing formation and growth of additional intermetallic compounds 516, but inhibiting void formation as the palladium substitutes on gold sites as gold diffuses into the aluminum.

Figure 7:
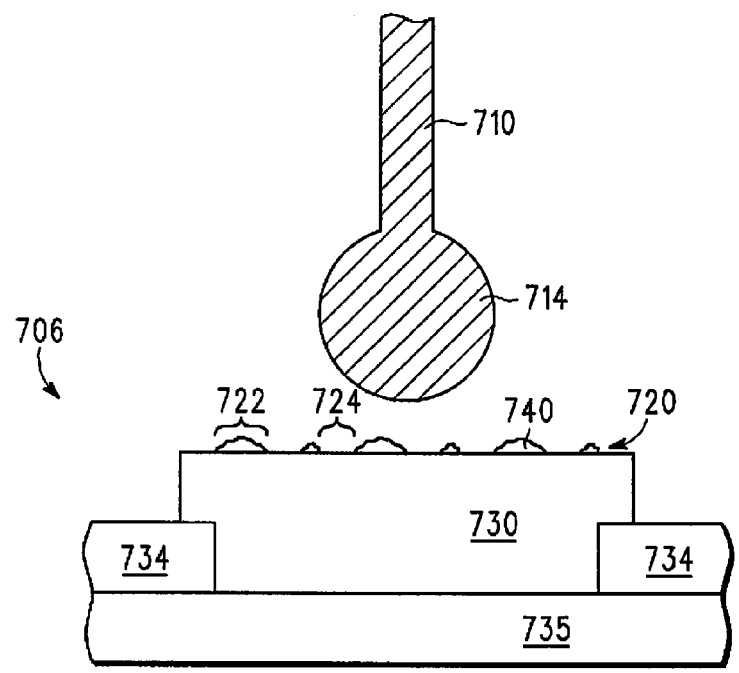
FIG. 7 depicts a method of forming a diffusion retardant layer between a bond pad and a free air ball.
Figure 8:
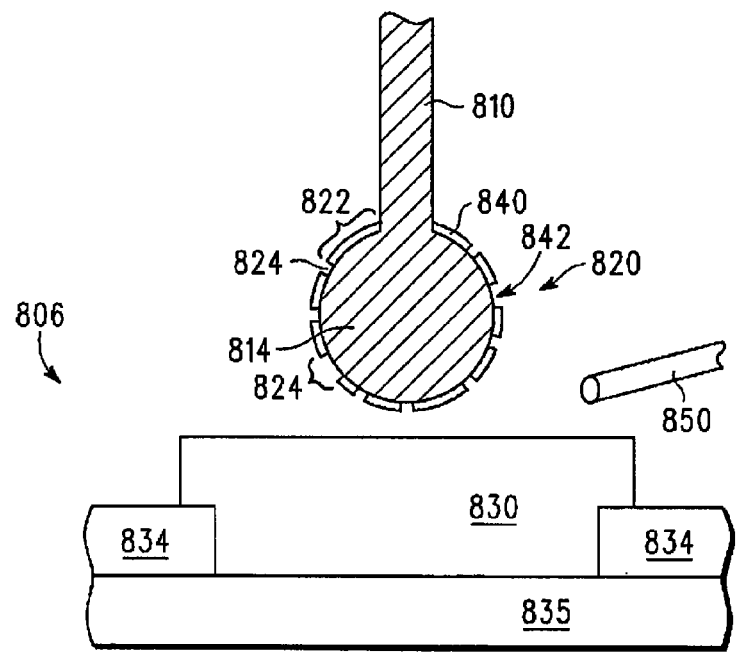
FIG. 8 depicts a method of forming a diffusion retardant layer between a bond pad and a free air ball.
Figure 9:
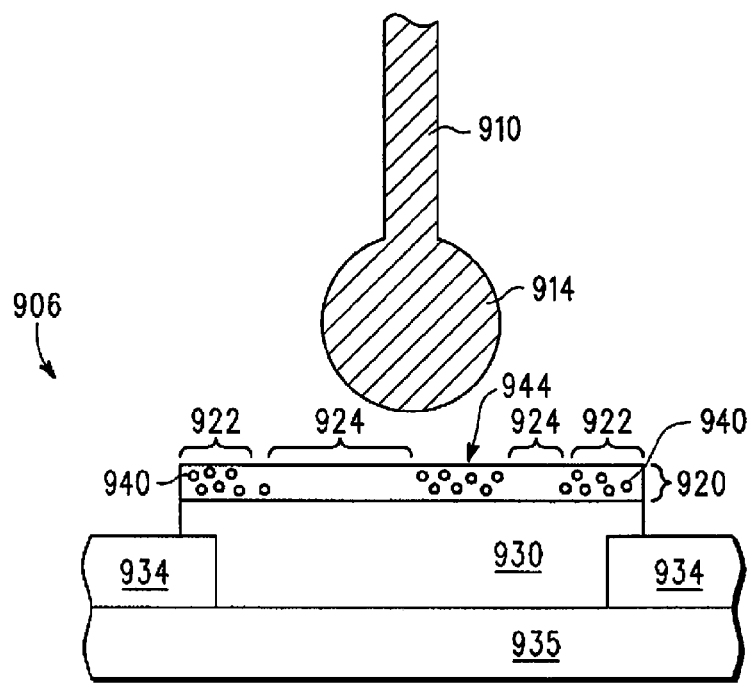
FIG. 9 depicts a method of forming a diffusion retardant layer between a bond pad and a free air ball.

FIGS. 7, 8, and 9 depict exemplary embodiments of the inventive method of forming reliable and long-lived aluminum-gold bonds. In these embodiments a diffusion retardant layer is interposed between the gold ball bond with gold wire attached and the aluminum bond pad prior to bonding. A diffusion retardant material may be applied to either surface as particles, as a very thin (less than approximately 10 nm) layer providing only incomplete coverage of the surface, or as a non-uniform, porous, or discontinuous film leaving portions of the surface exposed. The diffusion retardant material may be deposited by any of the commonly known methods for forming films, including films that offer incomplete surface coverage.

In the embodiment depicted in FIG. 7, a bond pad structure 706 includes an aluminum bond pad 730 overlying a substrate 735 and passivation regions 734. A diffusion retardant layer 720 is interposed between the aluminum bond pad 730 of the bond pad structure 706 and the gold free air ball 714 terminating gold wire 710 prior to bonding. In this example a discontinuous film 720 of palladium may be formed on the aluminum bond pad 730 by physical vapor deposition (PVD) of palladium alone, or by co-sputtering aluminum and palladium, or by other techniques. (Suitable film deposition techniques are numerous and well known in the art, and need not be further elaborated here.)

The diffusion retardant layer 720 itself, then, has regions 722 containing the diffusion retardant material and regions 724 essentially devoid of the material. The non-uniform distribution of diffusion retardant material 740 at the aluminum-gold interface during bonding allows for direct contact between gold and aluminum and the rapid formation of initial intermetallic compounds in regions 724 lacking in the diffusion retarding material, while their growth and additional formation is inhibited in regions 722 containing the diffusion retarding material. The diffusion retarding material 740 generally is one into which gold diffuses more slowly than gold diffuses into aluminum. Suitable materials include copper, molybdenum, rhodium, palladium, silver, rhenium, iridium, and platinum.

If desired, the deposition of the diffusion retardant material 740 may take place in situ, in the same chamber in which the aluminum bond pad material is laid down. In this case, both the aluminum and palladium may be processed together at the next processing step, avoiding the need for additional processing steps. Formation of the diffusion retardant layer 720 may alternatively take place ex situ by moving to a different deposition chamber and using techniques known to produce very thin, porous, discontinuous, or spotty layers of material on the bond pad material. The wirebonding process continues in the usual way, with the free air ball 714 compressed and scrubbed against the aluminum bond pad 730 of the bond pad structure 706 with the diffusion retardant layer 720 in between. The result is a non-uniform microstructure as shown in FIGS. 5 and 6.

As seen in FIG. 7, exemplary diffusion retardant layer 720 is depicted in cross-section. This view more clearly shows the non-uniform distribution of a diffusion retardant material 740 in a diffusion retardant layer 720. In this embodiment, islands 722 of material rich in the diffusion retardant material 740 form on isolated areas on the surface of the substrate on which it is deposited, here an aluminum bond pad 730; such a microstructure may equally well result from deposition of a diffusion retardant material 740 on a gold bond ball. (The diffusion retardant layer 720 may be discontinuous in all directions on the surface, not only the direction shown in this cross-sectional view.) Regions 724 surrounding the islands 722 are poor in retardant material 740, even devoid of deposited material altogether, as depicted in the example of FIG. 7. Surface morphologies such as shown in this view may be formed when the deposition of a film, for example by sputtering, proceeds to an average thickness of only a few atomic layers. In some embodiments the average thickness may be approximately three atomic layers, but the coverage non-uniform, leading to aggregation of a retardant material 740 only along grain boundaries or coalescence into islands 722. Such a microstructure may also result from deposition of the diffusion retardant material 740 as a particulate. Once the growth has entered a stage of complete coverage of the surface, diffusion of gold into the aluminum is slowed to a degree such that intermetallic compound formation is inhibited and the bond between the gold and the aluminum loses strength.

FIG. 8 depicts another method of forming a diffusion retardant layer 820 between a bond pad 830 and a free air ball 814. The bond pad 830 overlies a substrate 835 and passivation regions 834, as part of the bond pad structure 806. In this embodiment, the diffusion retardant layer 820 is applied to the FAB 814 terminating gold wire 810 prior to bonding. The figure shows an embodiment in which the diffusion retarding material 840, here copper, is introduced into the electric flame-off (EFO) chamber, in this case as feed wire 850. The copper or other diffusion retarding material 840 is vaporized during the EFO and deposits on some parts of the surface 842 of the free air ball 814. Alternatively, the diffusion retardant material 840 may be introduced in the gas phase into the region where the FAB 814 is formed by EFO, the diffusion retardant material 840 being deposited on some parts of the surface of the FAB 814. By whatever means deposited, the diffusion retardant layer 820 has regions 822 containing the diffusion retardant material 840 and regions 824 essentially devoid of the material. The free air ball 814 is then compressed against the aluminum bond pad 830 of the bond pad structure 806 and wirebond formation proceeds as described with reference to FIG. 7, resulting in a microstructure similar to that depicted in FIGS. 5 and 6.

FIG. 9 depicts an alternative method of forming a diffusion retardant layer 920 between a free air ball 914 terminating wire 910 and an aluminum bond pad 930 of a bond pad structure 906, the structure including passivation regions 934 and the aluminum bond pad 930 atop a substrate 935. In this case the diffusion retarding material 940, e.g., platinum, is applied to a near-surface region of the aluminum bond pad 930. The diffusion retardant material 940 may be deposited as a pure element or alloyed with aluminum or some other desired material. The resulting aluminum-platinum alloy is then allowed to segregate, with the diffusion retardant material 940 migrating to the bond pad surface 944. This segregation results in non-uniform distribution of the diffusion retardant material 940, forming regions 922 with and regions 924 without the material. Again, the platinum or other diffusion retardant material 940 may be applied in situ or ex situ, depending on the particular parameters of the process flow. It may be desirable to define the regions 922 containing the diffusion retardant material 940 using photolithographic or other patterning techniques. The free air ball 914 is then compressed against the aluminum bond pad 930 and wirebonding continues in the usual way, resulting in the microstructure of FIGS. 5 and 6.

Figure 10:
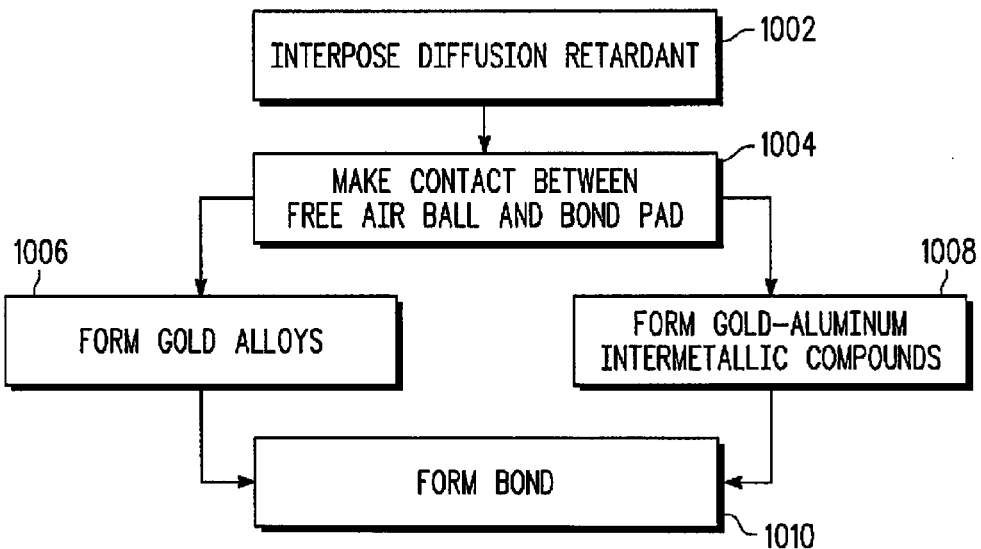
FIG. 10 describes the process flow of a method of forming a high-reliability, long-lived bond between a bond pad and a free air ball.

FIG. 10 describes a process flow for the inventive method of forming reliable and long-lived aluminum-gold bonds as depicted in FIGS. 5 and 6. In step 1002, a diffusion retardant layer 520 is interposed between the gold free air ball and the aluminum bond pad 530 of the bond pad structure 506 prior to bonding, providing localized regions 522 of diffusion retardant material 540. When contact is made between the gold free air ball and the aluminum bond pad 530 in step 1004, the bonded ball 515 is formed and intermetallic compounds 516 of gold and aluminum form in regions 524 by the direct contact between the aluminum and gold, that is, where the diffusion retardant layer 520 lacks the diffusion retardant material 540, as described in step 1006. At approximately the same time, in step 1008, gold forms alloys with the diffusion retardant material 540 in regions 522 of the diffusion retardant layer containing the diffusion retardant material 540, i.e., the doped regions. In step 1010, a continuous electrically conducting path is formed between the aluminum bond pad 530 and the gold bonded ball 515 by the intermetallic compounds 516. Steps 1006 and 1010 may occur virtually simultaneously or in succession; steps 1006 and 1008 may occur virtually simultaneously or in either order.

Localizing the diffusion retardant layer 520 at the aluminum-gold interface 526 during bonding modifies the properties of the gold and aluminum only in the vicinity of the bond. Gold wire resilience and low resistivity is maintained, allowing for small minimum loop size and ultra-fine wirebond pitches. Structural and electrical bonds are quickly established by initial intermetallic compound formation in regions 524 of the diffusion retardant layer 520 lacking the diffusion retardant material 540. At the same time, intermetallic compound formation is inhibited in regions 522 of the diffusion retardant layer 520 having higher concentrations of the diffusion retarding material 540. Over the lifetime of the bond, the diffusion retarding material 540 migrates away from the interface 526, substituting on gold sites and inhibiting void formation and coalescence, resulting in a long-lived, high-reliability bond, even when the device operates in a high-temperature environment.

Although the invention is described herein with reference to specific embodiments, various modifications and changes can be made without departing from the scope of the present invention as set forth in the claims below. For example, while FIGS. 7, 8, and 9 have been described with reference to specific choices of diffusion retardant materials, other diffusion retardant materials may be used to form the structures depicted in the figures. In addition, a diffusion retardant layer may be interposed between a gold bonding wire and substrate bond pads, if desired. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all of the claims.

Unless stated otherwise, terms such as "first" and "second" are used to arbitrarily distinguish between the elements such terms describe. Thus these terms are not necessarily intended to indicate temporal or other prioritization of such elements.

The invention claimed is:

1. A method of forming a gold-aluminum electrical interconnect, the method comprising:
   forming on one of gold and aluminum a diffusion retardant layer, the diffusion retardant layer comprising regions containing a diffusion retardant material and defining regions substantially devoid of the diffusion retardant material;
   bringing into contact the gold, the diffusion retardant layer, and the aluminum;
   forming at least one alloy of gold and the diffusion retardant material in regions containing the diffusion retardant material;
   forming at least one gold-aluminum intermetallic compound in regions substantially devoid of the diffusion retardant material; and
   forming a continuous electrically conducting path between the aluminum and the gold.

2. The method of claim 1, wherein:
   the gold has an interdiffusion rate into the diffusion retardant material less than an interdiffusion rate of the gold into the aluminum.

3. The method of claim 1, wherein:
forming the diffusion retardant layer comprises depositing the diffusion retardant material in situ on an aluminum alloy bond pad.

4. The method of claim 3, wherein:
depositing the diffusion retardant material comprises depositing the diffusion retardant material by physical vapor deposition.

5. The method of claim 1, wherein:
forming the diffusion retardant layer comprises forming in situ a layer of the diffusion retardant material alloyed with aluminum on an aluminum alloy bond pad; and
allowing the diffusion retardant material to segregate into regions containing the diffusion retardant material and regions substantially devoid of the diffusion retardant material.

6. The method of claim 1, wherein:
forming the diffusion retardant layer comprises depositing the diffusion retardant material in situ on a gold free air ball.

7. The method of claim 1, wherein:
forming the diffusion retardant layer comprises co-sputtering the diffusion retardant material and aluminum onto an aluminum alloy bond pad.

8. The method of claim 1, wherein:
the diffusion retardant material comprises one or more of copper, molybdenum, rhodium, palladium, silver, rhenium, iridium, and platinum.

9. The method of claim 8, wherein:
the diffusion retardant material comprises palladium; and
forming the diffusion retardant layer comprises forming the diffusion retardant layer one of an aluminum alloy bond pad and a gold free air ball.

10. A gold-aluminum electrical interconnect structure made by a method of forming a gold-aluminum electrical interconnect, the method comprising: forming on one of gold and aluminum a diffusion retardant layer, the diffusion retardant layer comprising regions containing a diffusion retardant material and defining regions substantially devoid of the diffusion retardant material; bringing into contact the gold, the diffusion retardant layer, and the aluminum; forming at least one alloy of gold and the diffusion retardant material in regions containing the diffusion retardant material; forming at least one gold-aluminum intermetallic compound in regions substantially devoid of the diffusion retardant material; and forming a continuous electrically conducting path between the aluminum and the gold comprising:

an interfacial region is comprised of at least one phase of gold-aluminum intermetallic compounds in regions substantially devoid of the diffusion retardant material, and at least one phase of gold alloyed with the diffusion retardant material in regions containing the diffusion retardant material.

* * * * *